(12) United States Patent
Matsushita et al.

(10) Patent No.: US 10,631,450 B2
(45) Date of Patent: Apr. 21, 2020

(54) COMPONENT MOUNTING SYSTEM, COMPONENT MOUNTER AND COMPONENT MOUNTING METHOD

(71) Applicant: YAMAHA HATSUDOKI KABUSHIKI KAISHA, Shizuoka (JP)

(72) Inventors: Daisuke Matsushita, Shizuoka (JP); Daisuke Kasuga, Shizuoka (JP)

(73) Assignee: YAMAHA HATSUDOKI KABUSHIKI KAISHA, Shizuoka (JP)

( * ) Notice: Subject to any disclaimer, the term of this patent is extended or adjusted under 35 U.S.C. 154(b) by 158 days.

(21) Appl. No.: 15/741,672

(22) PCT Filed: Jul. 10, 2015

(86) PCT No.: PCT/JP2015/069884
§ 371 (c)(1),
(2) Date: Jan. 3, 2018

(87) PCT Pub. No.: WO2017/009896
PCT Pub. Date: Jan. 19, 2017

(65) Prior Publication Data
US 2018/0199476 A1  Jul. 12, 2018

(51) Int. Cl.
*H05K 13/04* (2006.01)
*H05K 13/08* (2006.01)
(Continued)

(52) U.S. Cl.
CPC ....... *H05K 13/0408* (2013.01); *B23K 1/0016* (2013.01); *H05K 13/0465* (2013.01);
(Continued)

(58) Field of Classification Search
None
See application file for complete search history.

(56) References Cited

U.S. PATENT DOCUMENTS

2017/0273227 A1* 9/2017 Ota .................. H05K 13/04

FOREIGN PATENT DOCUMENTS

JP  H10-321653 A  12/1998
JP  5292163 B2 *  9/2013

OTHER PUBLICATIONS

Machine Translation of Japanese Patent 5292163, Date Unknown.*
International Search Report issued in PCT/JP2015/069884; dated Oct. 13, 2015.

* cited by examiner

*Primary Examiner* — Jeffry H Aftergut
(74) *Attorney, Agent, or Firm* — Studebaker & Brackett PC

(57) ABSTRACT

A component mounting system reduces the waste of components while mounting components via an application material. The system determines whether or not to permit the start of the mounting process to a plurality of applying locations based on the post-application elapsed time that has elapsed after the application of the adhesive to the applying location. That is, the system predicts the post-application elapsed time exceeds the time limit at the mounting timing at which the component is mounted in the mounting process for each applying location. If the plurality of applying locations include no applying location where the post-application elapsed time exceeds the time limit at the mounting timing, the start of the mounting process is permitted. However, if there is any applying location where the post-application elapsed time exceeds the time limit at the mounting timing, the start of the mounting process is prohibited.

12 Claims, 11 Drawing Sheets

(51) Int. Cl.
  *B23K 1/00* (2006.01)
  *B23K 101/42* (2006.01)
  *H05K 3/30* (2006.01)
(52) U.S. Cl.
  CPC ......... *H05K 13/0469* (2013.01); *H05K 13/08* (2013.01); *B23K 2101/42* (2018.08); *H05K 3/303* (2013.01)

FIG.6

| APPLYING LOCATION | APPLYING TIMING Td |
|---|---|
| P1 | 2014/09/18 10:35:23 |
| P2 | 2014/09/18 10:35:24 |
| P3 | 2014/09/18 10:35:24 |
| P4 | ... |
| P5 | ... |
| P6 | ... |
| P7 | ... |
| P8 | ... |
| P9 | ... |
| P10 | ... |
| P11 | ... |
| P12 | ... |
| P13 | ... |
| P14 | ... |
| P15 | ... |
| P16 | ... |
| P17 | ... |
| P18 | ... |
| P19 | 2014/09/18 10:36:10 |

FIG.8

| APPLYING LOCATION | APPLYING TIMING Td | MOUNTING TIMING Tm |
|---|---|---|
| P1 | 2014/09/18 10:35:23 | 2014/09/18 10:37:20 |
| P2 | 2014/09/18 10:35:24 | 2014/09/18 10:37:21 |
| P3 | 2014/09/18 10:35:24 | 2014/09/18 10:37:22 |
| P4 | ... | ... |
| P5 | ... | ... |
| P6 | ... | ... |
| P7 | ... | ... |
| P8 | ... | ... |
| P9 | ... | ... |
| P10 | ... | ... |
| P11 | ... | ... |
| P12 | ... | ... |
| P13 | ... | ... |
| P14 | ... | ... |
| P15 | ... | ... |
| P16 | ... | ... |
| P17 | ... | ... |
| P18 | ... | ... |
| P19 | 2014/09/18 10:36:10 | 2014/09/18 10:38:05 |

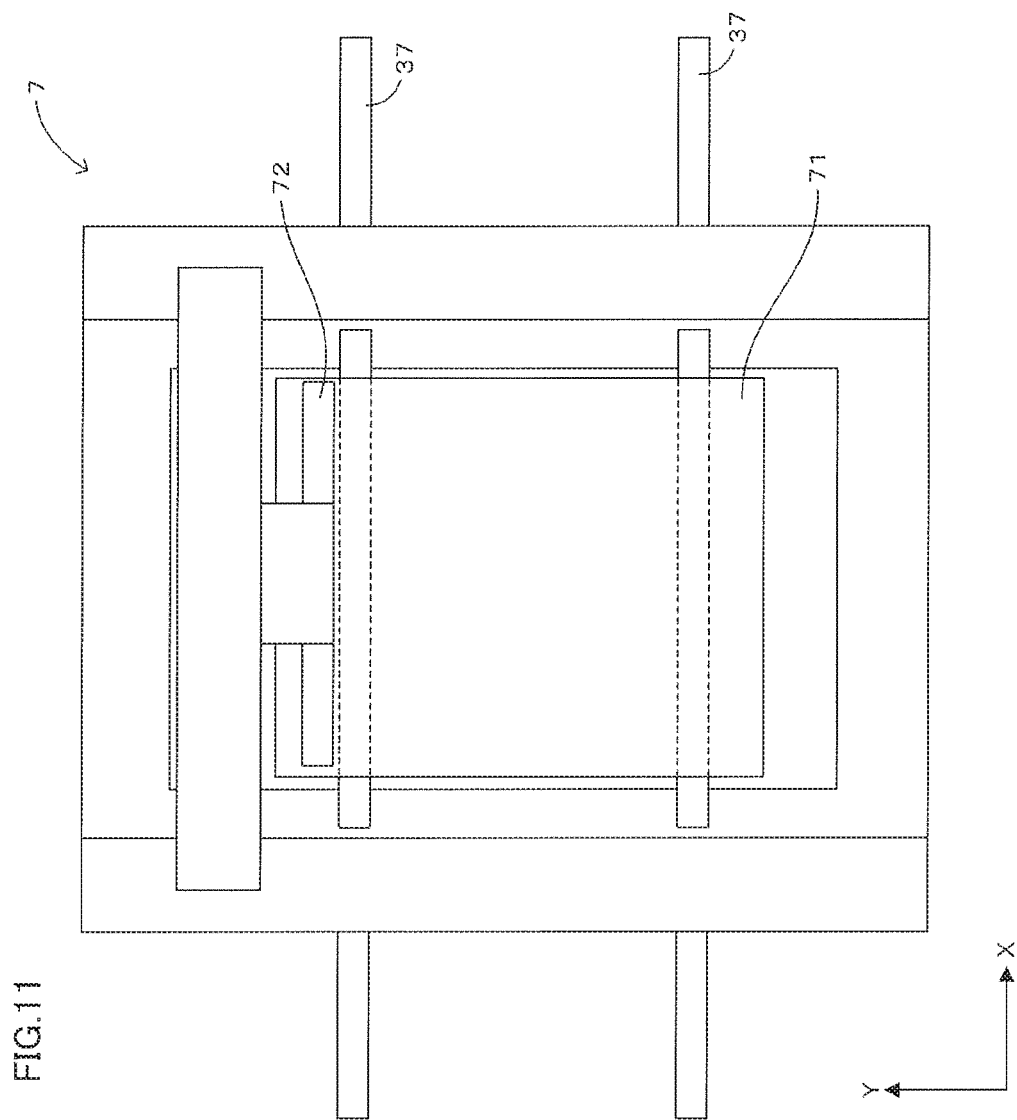

COMPONENT MOUNTING SYSTEM, COMPONENT MOUNTER AND COMPONENT MOUNTING METHOD

CROSS-REFERENCE TO RELATED APPLICATION

This application is a National Stage of International Patent Application No. PCT/JP2015/069884, filed Jul. 10, 2015, the entire content of which is incorporated herein by reference.

TECHNICAL FIELD

This disclosure relates to a technique for mounting components on a board by placing the components on an application material such as adhesive or solder applied to the board.

BACKGROUND

JP H10-321653A discloses a bonding apparatus for bonding components to a board via adhesive applied to the board. In such a bonding apparatus, if an elapsed time after the application of the adhesive to the board becomes longer, the viscosity of the adhesive changes and it may not be possible to properly bond the components to the board. Accordingly, in JP H10-321653A, the elapsed time after the application of the adhesive to the board is measured in parallel with a bonding operation and the bonding operation is stopped if this elapsed time exceeds a predetermined time.

SUMMARY

A configuration for stopping the bonding operation in execution if the elapsed time after the application of the adhesive becomes longer is preferred in that the placement of the components on the altered adhesive can be suppressed. However, after a mounting process for successively mounting a plurality of components on one board is started, if the elapsed time after the application of the adhesive exceeds the predetermined time during the mounting process, this mounting operation is stopped and the components mounted on the board thus far may be wasted.

The present disclosure was developed in view of the above problem and aims to provide a technique enabling the suppression of the waste of components while mounting components via an application material in a satisfactory state.

To achieve the above aim, a component mounting system according to the present disclosure comprises a component mounting unit including a component mounter that places components at a plurality of target locations of a board having an application material applied to the target locations and configured to perform a mounting process to place the components at the plurality of target locations of the board in a predetermined mounting sequence by the component mounter. The component mounting system further comprises a controller configured to perform a determining process to determine whether or not to permit the component mounting unit to start the mounting process on the board based on a post-application elapsed time elapsed after the application of the application material to the target locations before the component mounting unit starts the mounting process on the board. The determining process is a process to predict whether or not the post-application elapsed time exceeds a time limit at a mounting timing, at which the component is mounted in the mounting process, for each target location, prohibit the start of the mounting process if there is, out of the plurality of target locations, any target location where the post-application elapsed time exceeds the time limit at the mounting timing and permit the start of the mounting process if the plurality of target locations include no target location where the post-application elapsed time exceeds the time limit at the mounting timing.

Also to achieve the above aim, a component mounter according to the present disclosure comprises a component mounting station configured to perform a mounting process to place components at a plurality of target locations of a board having an application material applied to the plurality of target locations in a predetermined mounting sequence. The component mounter further comprises a controller configured to perform a determining process to determine whether or not to permit the component mounting station to start the mounting process on the board based on a post-application elapsed time elapsed after the application of the application material to the target locations before the component mounting station starts the mounting process on the board. The determining process is a process to predict whether or not the post-application elapsed time exceeds a time limit at a mounting timing, at which the component is mounted in the mounting process, for each target location, prohibit the start of the mounting process if there is, out of the plurality of target locations, any target location where the post-application elapsed time exceeds the time limit at the mounting timing and permit the start of the mounting process if the plurality of target locations include no target location where the post-application elapsed time exceeds the time limit at the mounting timing.

To further achieve the above aim, a component mounting method according to the present disclosure comprises applying an application material to each of a plurality of target locations provided on a board; performing a determining process to determine whether or not to permit the start of a mounting process to place components on each of the plurality of target locations in a predetermined mounting sequence based on a post-application elapsed time elapsed after the application of the application material to the target locations before the start of the mounting process. The component mounting method further comprises starting the mounting process when the start of the mounting process is permitted in the determining process. The determining process is a process to predict whether or not the post-application elapsed time exceeds a time limit at a mounting timing, at which the component is mounted in the mounting process, for each target location, prohibit the start of the mounting process if there is, out of the plurality of target locations, any target location where the post-application elapsed time exceeds the time limit at the mounting timing and permit the start of the mounting process if the plurality of target locations include no target location where the post-application elapsed time exceeds the time limit at the mounting timing.

In the component mounting system, the component mounter and the component mounting method, whether or not to permit the start of the mounting process to place the components on each of the plurality of target locations in the predetermined mounting sequence is determined based on the post-application elapsed time elapsed from the application of the application material to the target locations (determining process). In this determining process, whether or not the post-application elapsed time exceeds the time limit at the mounting timing, at which the component is mounted in the mounting process, is predicted for each target location.

If the plurality of target locations include no target location where the post-application elapsed time exceeds the time limit at the mounting timing, the start of the mounting process is permitted. This can suppress the target locations where the post-application elapsed time exceeds the time limit during the mounting process and the components can be mounted via the application material in a satisfactory state. On the other hand, if there is, out of the plurality of target locations, any target location where the post-application elapsed time exceeds the time limit at the mounting timing, the start of the mounting process is prohibited. This suppresses the occurrence of a situation where the mounting process is stopped due to the target location where the post-application elapsed time exceeds the time limit after the start of the mounting process and suppresses the waste of the components. In this way, in the disclosure, it is possible to suppress the waste of the components while mounting the components via the application material in a satisfactory state.

The component mounting system may be configured to further comprise a board conveying unit configured to convey the board in a board conveying direction. The component mounting unit of the component mounting system includes a plurality of the component mounters arranged side by side in the board conveying direction and causes the plurality of component mounters to divide the mounting process, and each component mounter places the components at the target locations in charge, out of the plurality of target locations of the board carried from an upstream side in the board conveying direction. The board conveying unit has a judging location provided in a most upstream mounter or upstream in the board conveying direction of the most upstream mounter, the most upstream mounter being located on a most upstream side in the board conveying direction out of the plurality of component mounters; and the controller performs the determining process for the mounting process on the board at the judging location when the board reaches the judging location. In such a configuration, the above determining process is performed before the start of the mounting process divided by the plurality of component mounters. If there is, out of the plurality of target locations, any target location where the post-application elapsed time exceeds the time limit at the mounting timing, the start of the mounting process is prohibited and none of the plurality of component mounters mounts the components on the board. Such a configuration is preferred since the waste of the components is suppressed in any of the plurality of component mounters.

The component mounting system may be configured to further comprise a notifying unit configured to make a notification to an operator, such that the controller notifies an error by the notifying unit when the prohibition of the start of the mounting process is determined in the determining process. In such a configuration, the operator can recognize the occurrence of an error and appropriately perform maintenance such as the removal of the board for which the start of the mounting process was prohibited.

The component mounting system may be configured to further comprise a dispenser configured to apply the application material to each of the plurality of target locations of the board. The component mounting unit of the component mounting system performs the mounting process on the board having the application material applied to each target location by the dispenser. The controller adjusts an applying timing, at which the application material is applied by the dispenser, for each target location of one board according to the progress of the mounting process on a previous board completed with the application of the application material earlier than the one board. In such a configuration, the application material is applied to the one board following the application of the application material to the previous board and the mounting process is performed in the order of the previous board and the one board. The applying timing, at which the application material is applied to each of the plurality of target locations of the one board, is adjusted according to the progress of the mounting process on the previous board. Thus, such as when the progress of the mounting process on the previous board is later than planned, such an adjustment to delay the applying timing, at which the adhesive is applied to each of the target locations of the one board, is possible. As a result, it is possible to mount the components via the application material in a satisfactory state by suppressing the post-application elapsed time from the applying timing to the mounting timing to be short.

The component mounting system may be configured so that the controller obtains the applying timing, at which a predicted elapsed time elapsed from the applying timing to a mounting timing at which the component is mounted in the mounting process is predicted to be within the time limit for each target location of the one board based on the progress of the mounting process on the previous board and causes the dispenser to apply the application material to each target location of the one board at the obtained applying timing. This can suppress the post-application elapsed time from the applying timing to the mounting timing to be short and enables the components to be mounted via the application material in a satisfactory state.

The component mounting system may be configured so that the controller predicts the predicted elapsed time for each target location of the one board based on the progress of the mounting process on the previous board while changing the applying timing for each target location of the one board and causes the dispenser to apply the application material to each target location of the one board at the applying timing at which the predicted elapsed time is judged to be within the time limit for all the target locations of the one board. This can suppress the post-application elapsed time from the applying timing to the mounting timing to be short and enables the components to be mounted via the application material in a satisfactory state.

In summary, various specific application materials are considered. For example, the application material may be adhesive or solder. According to the embodiment of the present disclosure, it is possible to suppress the waste of components while mounting components via an application material in a satisfactory state.

BRIEF DESCRIPTION OF DRAWINGS

FIG. 6 is a table schematically showing an example of the board information recording applying timings;

FIG. 8 is a table schematically showing an example of the board information recording the mounting timings;

FIG. 11 is a plan view schematically showing an example of a printer provided in a component mounting system.

DETAILED DESCRIPTION

Figure 1:
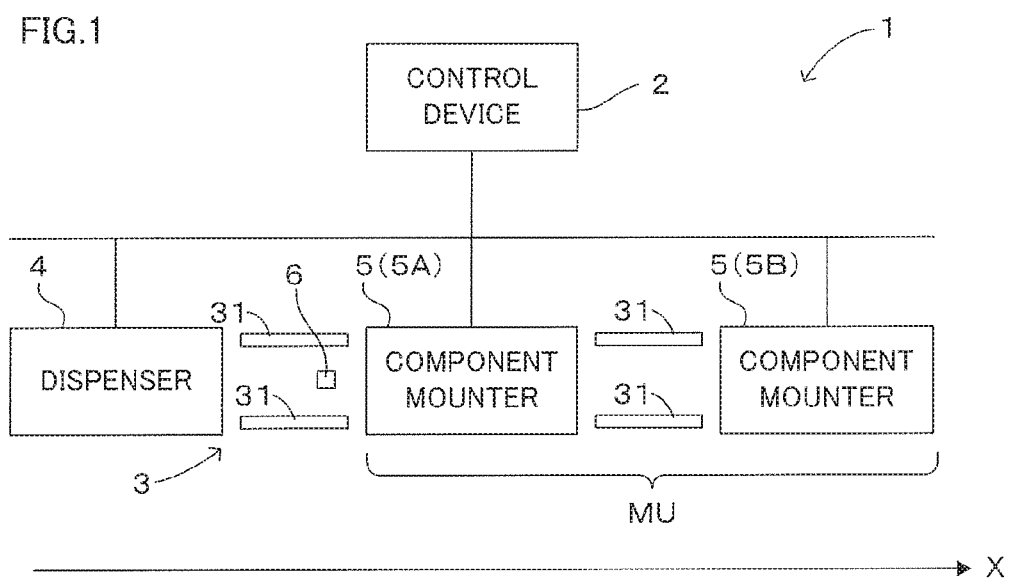
FIG. 1 is a block diagram showing an example of a component mounting system according to the disclosure.

FIG. 1 is a block diagram showing an example of a component mounting system according to the disclosure. The component mounting system 1 comprises a control device 2, a board conveying unit 3, a dispenser 4 and two component mounters 5. The dispenser 4 and the two component mounters 5 are arrayed in series in an X direction, and the board conveying unit 3 successively carries a board S (FIG. 4) in the form of a flat plate to the dispenser 4 and the two component mounters 5 in this order by conveying the board S in the X direction. Note that, to distinguish the two component mounters 5, the component mounter 5 on an upstream side in the X direction is denoted by reference sign 5A and the component mounter 5 on a downstream side in the X direction is denoted by reference sign 5B as appropriate.

The dispenser 4 applies adhesive to the board S carried thereinto, and each component mounter 5 mounts components on the board S carried thereinto. Further, the board conveying unit 3 includes a pair of buffer conveyors 31, 31 between the adjacent dispenser 4 and component mounter 5 and between the adjacent component mounters 5, 5. Thus, if the board S cannot be carried into each component mounter 5, this board S can be caused to wait by the buffer conveyors 31, 31 upstream of and adjacent to the component mounter 5 as a conveyance destination in the X direction.

Further, the buffer conveyors 31, 31 between the dispenser 4 and the component mounter 5 are provided with a board recognition unit 6 for reading an identifier attached to the board S having reached the buffer conveyors 31, 31. For example, the identifier of the board S is constituted by a barcode, and the board recognition unit 6 is constituted by a barcode scanner.

Figure 2:
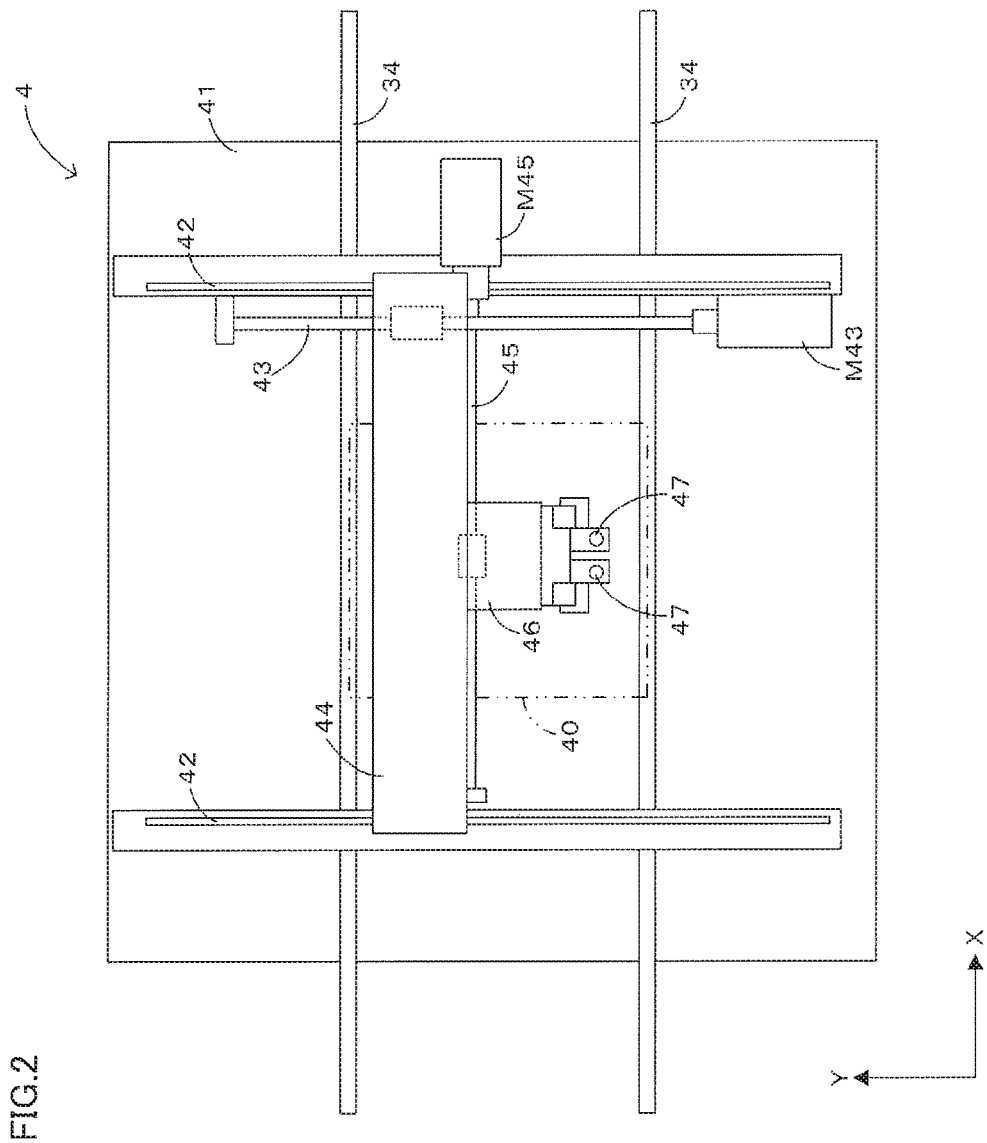
FIG. 2 is a plan view schematically showing an example of the dispenser provided in the component mounting system of FIG. 1.

FIG. 2 is a plan view schematically showing an example of the dispenser provided in the component mounting system of FIG. 1. The dispenser 4 includes a base 41 for supporting a pair of conveyors 34, 34 constituting a part of the board conveying unit 3, and applies the adhesive to the board S carried to and fixed at a working position 40 by the conveyors 34, 34. The adhesive applied by the dispenser 4 contains moisture and the viscosity of the adhesive increases due to the evaporation of the moisture in the adhesive with the elapse of time after the application to the board S.

In the dispenser 4, a pair of Y-axis rails 42, 42 extending in a Y direction perpendicular to the X direction, a Y-axis ball screw 43 extending in the Y direction and a Y-axis servo motor M43 for rotationally driving the Y-axis ball screw 43 are provided, and a head supporting member 44 is fixed to a nut of the Y-axis ball screw 43 while being supported on the pair of Y-axis rails 42, 42 movably in the Y direction. An X-axis ball screw 45 extending in the X direction and an X-axis servo motor M45 for rotationally driving the X-axis ball screw 45 are mounted on the head supporting member 44, and a head unit 46 is fixed to a nut of the X-axis ball screw 45 while being supported on the head supporting member 44 movably in the X direction. Thus, the head unit 46 can be moved in the Y direction by rotating the Y-axis ball screw 43 by the Y-axis servo motor M43, and the head unit 46 can be moved in the X direction by rotating the X-axis ball screw 45 by the X-axis servo motor M45.

The head unit 46 includes two dispenser heads 47 arranged side by side in the X direction. Each dispenser head 47 includes a syringe for containing liquid adhesive and the adhesive is pushed out from a nozzle of the syringe. In such a dispenser 4, the dispenser heads 47 are located above the board S at the working position 40 by the X-axis servo motor M45 and the Y-axis servo motor M43 and the adhesive is pushed out from the dispenser heads 47, whereby the adhesive is applied to the board S.

Figure 3:
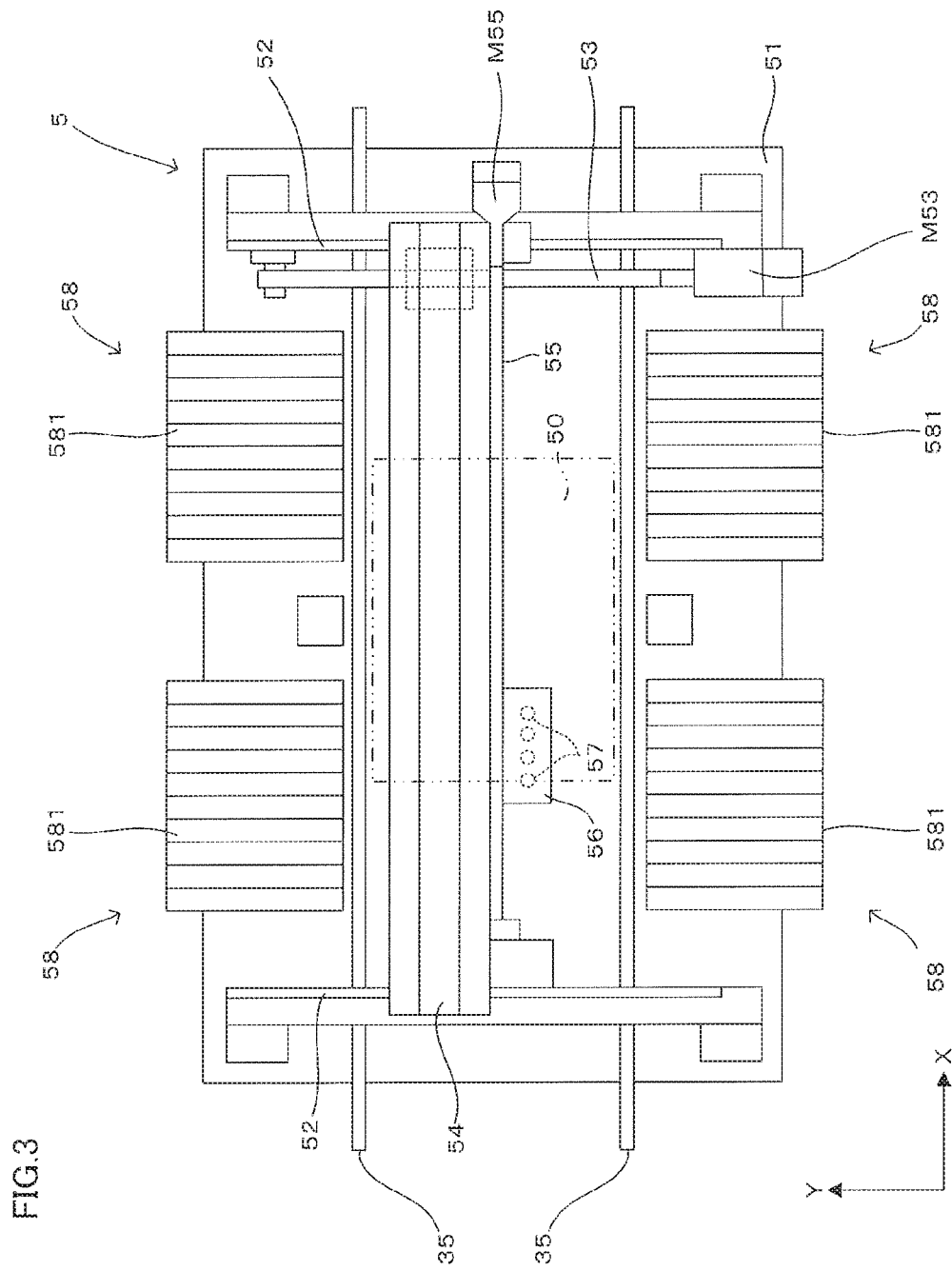
FIG. 3 is a plan view schematically showing an example of the component mounter provided in the component mounting system of FIG. 1.

FIG. 3 is a plan view schematically showing an example of the component mounter provided in the component mounting system of FIG. 1. The component mounter 5 includes a base 51 for supporting a pair of conveyors 35, 35 constituting a part of the board conveying unit 3, and mounts components on the board S carried to and fixed at a working position 50 by the conveyors 35, 35.

In the component mounter 5, a pair of Y-axis rails 52, 52 extending in the Y direction, a Y-axis ball screw 53 extending in the Y direction and a Y-axis servo motor M53 for rotationally driving the Y-axis ball screw 53 are provided, and a head supporting member 54 is fixed to a nut of the Y-axis ball screw 53 while being supported on the pair of Y-axis rails 52, 52 movably in the Y direction. An X-axis ball screw 55 extending in the X direction and an X-axis servo motor M55 for rotationally driving the X-axis ball screw 55 are mounted on the head supporting member 54, and a head unit 56 is fixed to a nut of the X-axis ball screw 55 while being supported on the head supporting member 54 movably in the X direction. Thus, the head unit 56 can be moved in the Y direction by rotating the Y-axis ball screw 53 by the Y-axis servo motor M53, and the head unit 56 can be moved in the X direction by rotating the X-axis ball screw 55 by the X-axis servo motor M55.

The head unit 56 includes four mounting heads 57 arranged side by side in the X direction. Each mounting head 57 can suck and hold a component by a nozzle attached to the lower end thereof. Further, two component supplying units 58 are arranged side by side in the X direction at each of both sides of the pair of conveyors 35, 35 in the Y direction. Each component supplying unit 58 includes a plurality of tape feeders 581, and a reel on which a tape accommodating components in the form of small pieces such as integrated circuits, transistors and capacitors (chip electronic components) at predetermined intervals is wound is arranged in each tape feeder 581. The tape feeder 581 supplies the components in the tape by intermittently feeding the tape toward the head unit 56.

In such a component mounter 5, the mounting heads 57 are moved to above the tape feeders 581 by the X-axis servo motor M55 and the Y-axis servo motor M53 and the components supplied by the tape feeders 581 are sucked by the mounting heads 57. Subsequently, the mounting heads 57 are moved to above the board S at the working position 50 and place the components on the board S by releasing the suction of the components by the mounting heads 57. In this way, the components are placed at locations of the board S where the adhesive was applied by the dispenser 4.

Figure 4:
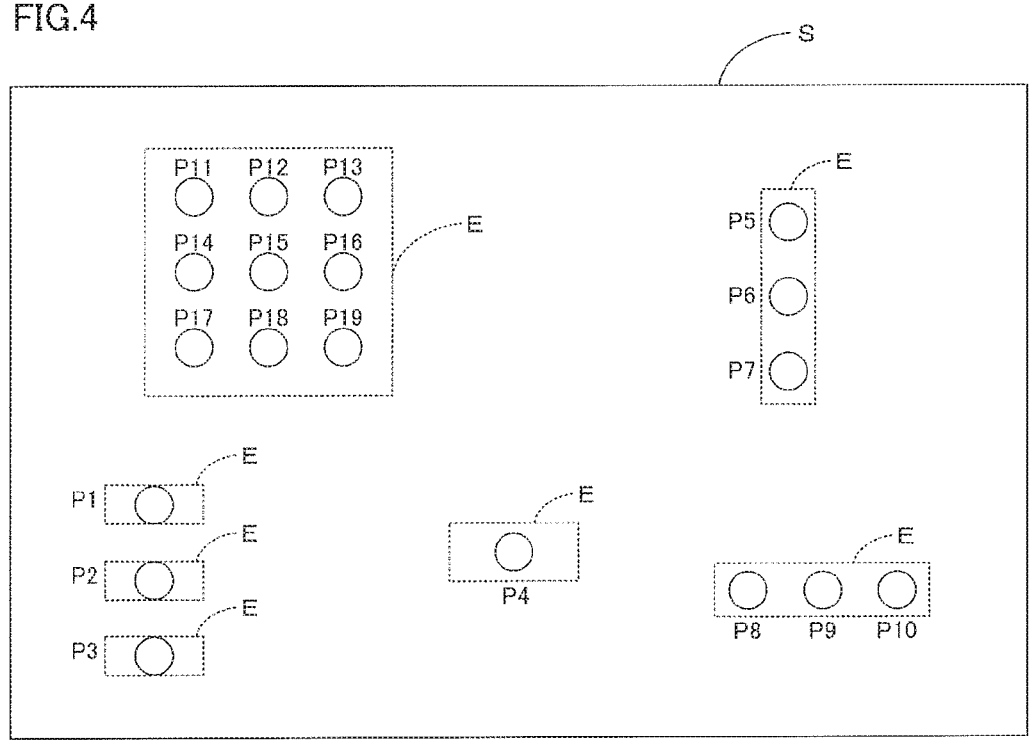
FIG. 4 is a plan view schematically showing an example of the board.

FIG. 4 is a plan view schematically showing an example of the board. In FIG. 4, reference signs P1 to P19 respectively denote applying locations where the adhesive is to be applied. Note that the applying locations are collectively called the applying locations P without distinguishing the applying locations P1 to P19 as appropriate below. Further, each location denoted by reference sign E is a placing location where a component is to be placed, and one component is placed at one placing location E. In an example of FIG. 4, each applying location P is provided within the placing location E for the component to be bonded by the adhesive applied to the applying location P. There are placing locations E including a single applying location P and there are also placing locations E including a plurality of applying locations P.

In the above component mounting system 1, an applying process for applying the adhesive to each applying location P of the board S in a predetermined application sequence is performed by the dispenser 4. Further, a mounting process for placing the component at each placing location E of the board S completed with the applying process is performed by a component mounting unit MU constituted by the two component mounters 5. That is, the control device 2 causes these two component mounters 5, 5, to divide the mounting process and each component mounter 5 places the components at the placing locations E in charge, out of the placing locations E of the board S carried thereinto from an upstream side in the X direction.

Figure 5:
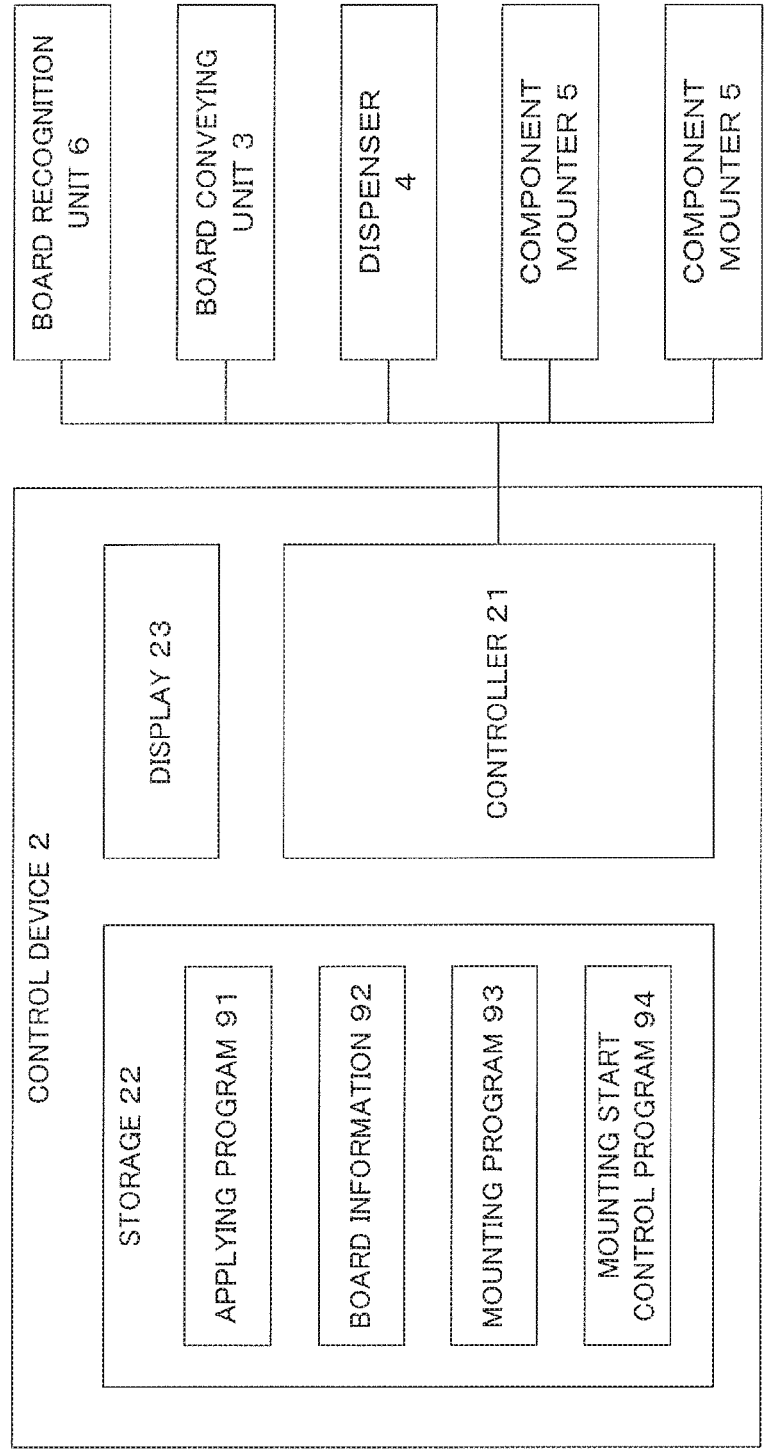
FIG. 5 is a block diagram showing an example of an electrical configuration provided in the component mounting system of FIG. 1.

FIG. 5 is a block diagram showing an example of an electrical configuration provided in the component mounting system of FIG. 1. The control device 2 is a computer and includes a controller 21 constituted by a CPU (Central Processing Unit), a RAM (Random Access Memory) and the like, a storage 22 constituted by a HDD (Hard Disk Drive), and a display 23.

The controller 21 applies the adhesive to each applying location P in an application sequence specified in an applying program 91 stored in the storage 22 (applying process) by controlling the dispenser 4 in accordance with the applying program 91. In parallel with this, the controller 21 generates board information 92 recording a timing (applying timing Td) at which the adhesive was applied to each applying location P of a target board S in the applying process, and stores the board information 92 in the storage 22 in association with an identifier of the target board S. FIG. 6 is a table schematically showing an example of the board information recording applying timings, and the applying timing Td is recorded in correspondence with each applying location P in the board information 92.

When the applying process is completed, the controller 21 causes the board conveying unit 3 to carry the board S from the dispenser 4 to the buffer conveyors 31. Then, the controller 21 causes the board conveying unit 3 to carry the board S from the buffer conveyors 31 to the component mounter 5A at a timing at which the reception of the board S by the component mounter 5A is enabled. Subsequently, the controller 21 places the component at each placing location E in a mounting sequence specified in a mounting program 93 stored in the storage 22 (mounting process) by controlling the component mounting unit MU in accordance with the mounting program 93.

Specifically, the controller 21 causes the component mounter 5A to place the components at the placing locations E in charge, and causes the board conveying unit 3 to carry the board S from the component mounter 5A to the buffer conveyors 31 when the placement of the components in charge is completed by the component mounter 5A. Further, the controller 21 causes the board conveying unit 3 to carry the board S from the buffer conveyors 31 to the component mounter 5B at a timing at which the reception of the board S by the component mounter 5B is enabled. Subsequently, the controller 21 causes the component mounter 5B to place the components at the placing locations E in charge, and causes the board conveying unit 3 to carry out the board S from the component mounter 5B when the placement of the components in charge is completed by the component mounter 5B. In this way, the component placed at each placing location E is mounted on the board S via the adhesive applied to the applying location(s) P within the placing location E.

In this embodiment, a mounting start control program 94 is stored in the storage 22, and the controller 21 determines whether or not to permit the start of the mounting process to the component mounting unit MU before the start of the mounting process (mounting start control process) by executing the mounting start control program 94 before the mounting process based on the mounting program 93 is started.

Figure 7:
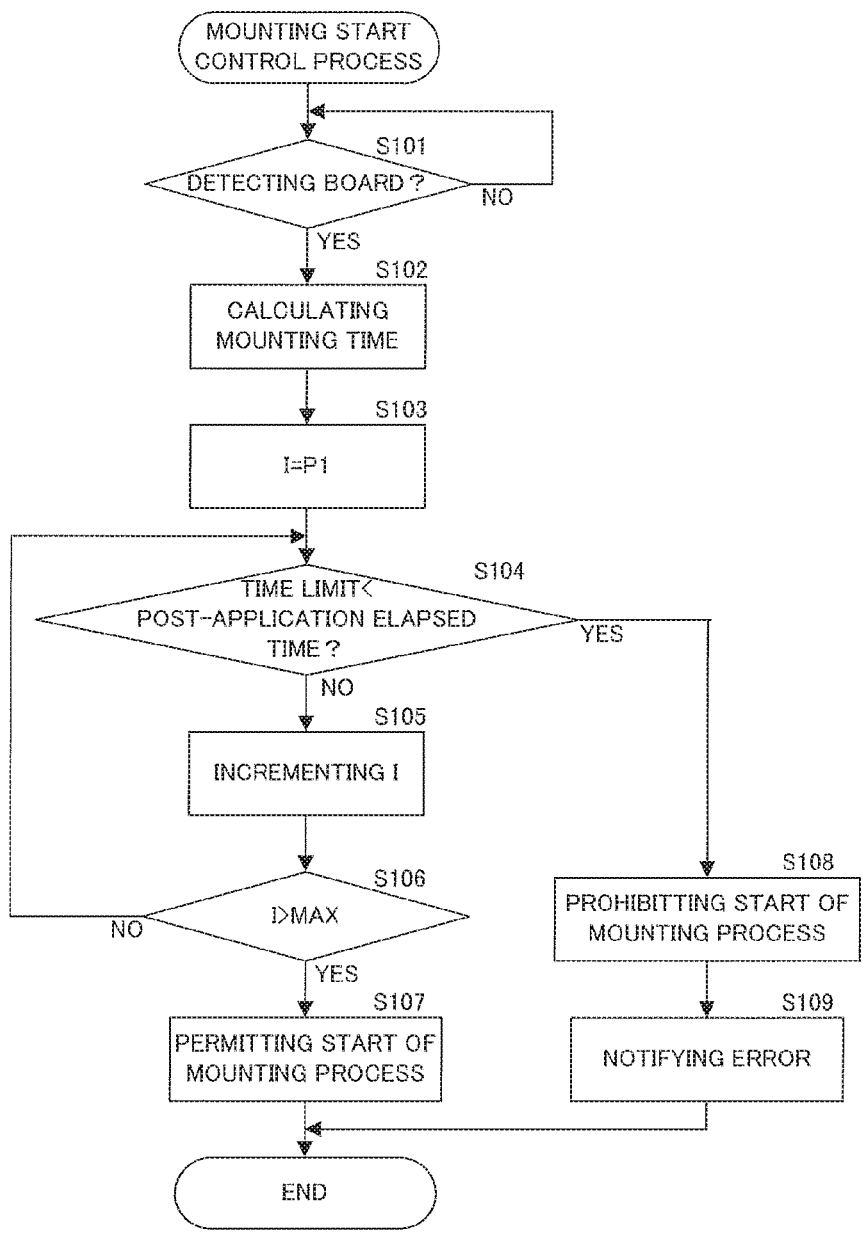
FIG. 7 is a flow chart showing an example of the mounting start control process.

FIG. 7 is a flow chart showing an example of the mounting start control process. In Step S101, the controller 21 monitors an output of the board recognition unit 6. When the board S completed with the applying process is carried from the dispenser 4 to the buffer conveyors 31 and the board recognition unit 6 succeeds in reading the identifier of this board S, i.e. the board recognition unit 6 detects this board S ("YES" in Step S101), an advance is made to Step S102.

In Step S102, a timing at which the component is mounted at each applying location P when the mounting process is performed on the detected board S is calculated. Specifically, the controller 21 simulates the mounting process performed by the component mounting unit MU to the detected board S, and obtains the timing (mounting timing Tm) at which the component is mounted at each applying location P in this simulation. Further, the mounting timing Tm obtained for each applying location P is recorded in the board information 92 associated with the identifier of the target board S. FIG. 8 is a table schematically showing an example of the board information recording the mounting timings, and the applying timing Td and the mounting timing Tm are recorded in correspondence with each applying location P in the board information 92.

When the mounting timings Tm are calculated for all the applying locations P1 to P19 in this way, a parameter I for identifying the applying location P is set at a minimum value, i.e. "P1" (Step S103). In Step S104, it is judged whether or not an elapsed time (post-application elapsed time Tp) from the applying timing Td, at which the adhesive was applied to the applying location P indicated by the parameter I, i.e. the applying location P1, exceeds a time limit T1 at the mounting timing Tm at which the component is predicted to be mounted at the applying location P1. Here, the post-application elapsed time Tp at the mounting timing Tm is expressed by the following relationship:

$$Tp = Tm - Td$$

using the applying timing Td and the mounting timing Tm. Thus, whether or not T1<Tm−Td is judged in Step S104.

If the post-application elapsed time Tp (=Tm−Td) at the mounting timing Tm is equal to or shorter than the time limit T1 (e.g. 5 minutes) ("NO in Step S104), the parameter I is incremented in Step S105. If it is judged that the parameter I does not exceed a maximum value, i.e. P19 (NO) in Step S106, a return is made to Step S104. In this way, whether or not an elapsed time (post-application elapsed time Tp) from the applying timing Td at which the adhesive was applied exceeds the time limit T1 is judged in a manner similar to the above for the applying location P indicated by the incremented parameter I.

When steps S104 to S106 are repeated until the parameter I exceeds the maximum value of P19 in Step S106, i.e. when the post-application elapsed time Tp at the mounting timing Tm is judged to be equal to or shorter than the time limit T1 for all the applying locations P1 to P19, the controller 21 permits the component mounting unit MU to start the mounting process (Step S107). On the other hand, if there is, out of all the applying locations P1 to P19, any applying location P where the post-application elapsed time Tp at the mounting timing Tm is judged to exceed the time limit T1 ("YES" in Step S104), the controller 21 prohibits the component mounting unit MU from starting the mounting process (Step S108) and displays, on the display 23, a message to the effect that an error has occurred. Such a display may be an instruction to an operator to remove the board S on the buffer conveyors 31 adjacent to the dispenser 4 since there is the applying location P where the post-application elapsed time Tp is predicted to exceed the time limit T1 at the mounting timing Tm.

As described above, in this embodiment, whether or not to permit the start of the mounting process for placing the component at each of a plurality of applying locations P in the predetermined mounting sequence is determined based on the post-application elapsed time Tp elapsed after the application of the adhesive to the applying location P (mounting start control process). In this mounting start control process, whether or not the post-application elapsed time Tp exceeds the time limit T1 at the mounting timing Tm at which the component is mounted in the mounting process is predicted for each applying location P (Step S104). If the plurality of applying locations P include no applying location P where the post-application elapsed time Tp exceeds the time limit T1 at the mounting timing Tm, the start of the mounting process is permitted (Step S107). This can suppress the applying location P where the post-application elapsed time Tp exceeds the time limit T1 during the mounting process and can realize the mounting of the components via the adhesive in a satisfactory state. On the other hand, if there is, out of the plurality of applying locations P, any applying location P where the post-application elapsed time Tp exceeds the time limit T1 at the mounting timing Tm, the start of the mounting process is prohibited (Step S108). This suppresses the occurrence of a situation where the mounting process is stopped due to the applying location P where the post-application elapsed time Tp exceeds the time limit T1 after the start of the mounting process and suppresses the waste of the components. In this way, in this embodiment, it is possible to suppress the waste of the components while mounting the components via the adhesive in a satisfactory state.

Further, the component mounting unit MU is constituted by a plurality of component mounters 5, and the controller 21 causes the plurality of component mounters 5 to divide the mounting process. Each component mounter 5 performs the mounting of the components at the applying locations P in charge (in other words, applying locations P within the placing locations E in charge). Further, the board recognition unit 6 is provided for the buffer conveyors 31 upstream in the X direction of a most upstream mounter 5 located on a most upstream side of these component mounters 5 in the X direction, and the controller 21 performs the mounting start control process for the mounting process on the board S on the buffer conveyors 31 when the board S reaches the buffer conveyors 31. In such a configuration, the above mounting start control process is performed before the start of the mounting process divided by the plurality of component mounters 5. If there is, out of the plurality of applying locations P, any applying location P where the post-application elapsed time Tp exceeds the time limit T1 at the mounting timing Tm, the start of the mounting process is prohibited and none of the plurality of component mounters 5 mounts the components on the board S. Such a configuration is preferred since useless mounting of the components is suppressed in any of the plurality of component mounters 5.

Further, if it is determined to prohibit the start of the mounting process by the mounting start control process, the controller 21 notifies an error to the display 23. In such a configuration, an operator can recognize the occurrence of an error and appropriately conduct maintenance such as the removal of the board S for which the start of the mounting process was prohibited.

In the above embodiment, the mounting start control process is performed to determine whether or not it is possible to start the mounting process by the component mounting unit MU. On the other hand, in a next embodiment, an application start control process is performed to determine whether or not it is possible to start the applying process by the dispenser 4. Such an embodiment is described using FIGS. 9 and 10.

Figure 9:
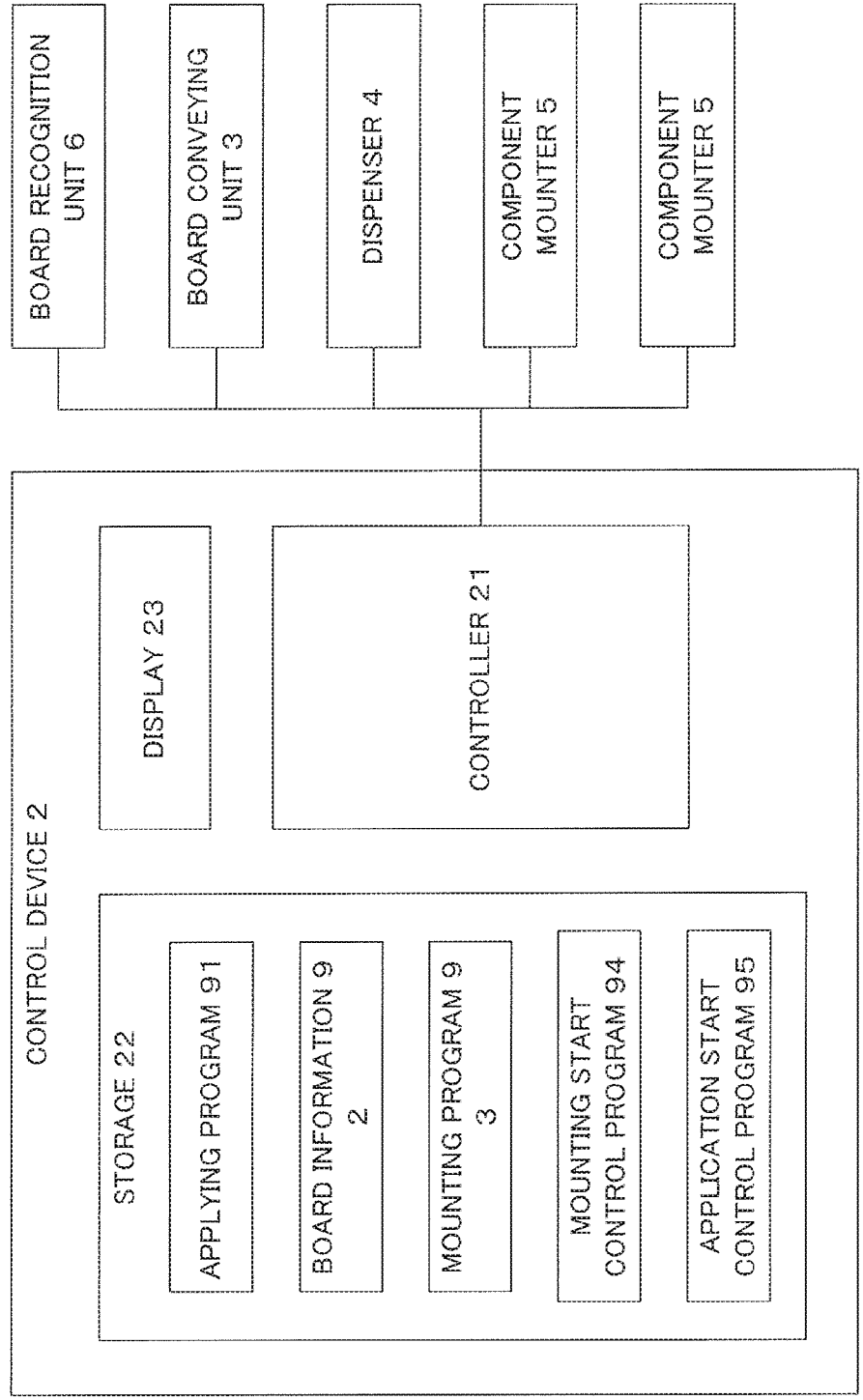
FIG. 9 is a block diagram showing another example of the electrical configuration provided in the component mounting system of FIG. 1.
Figure 10:
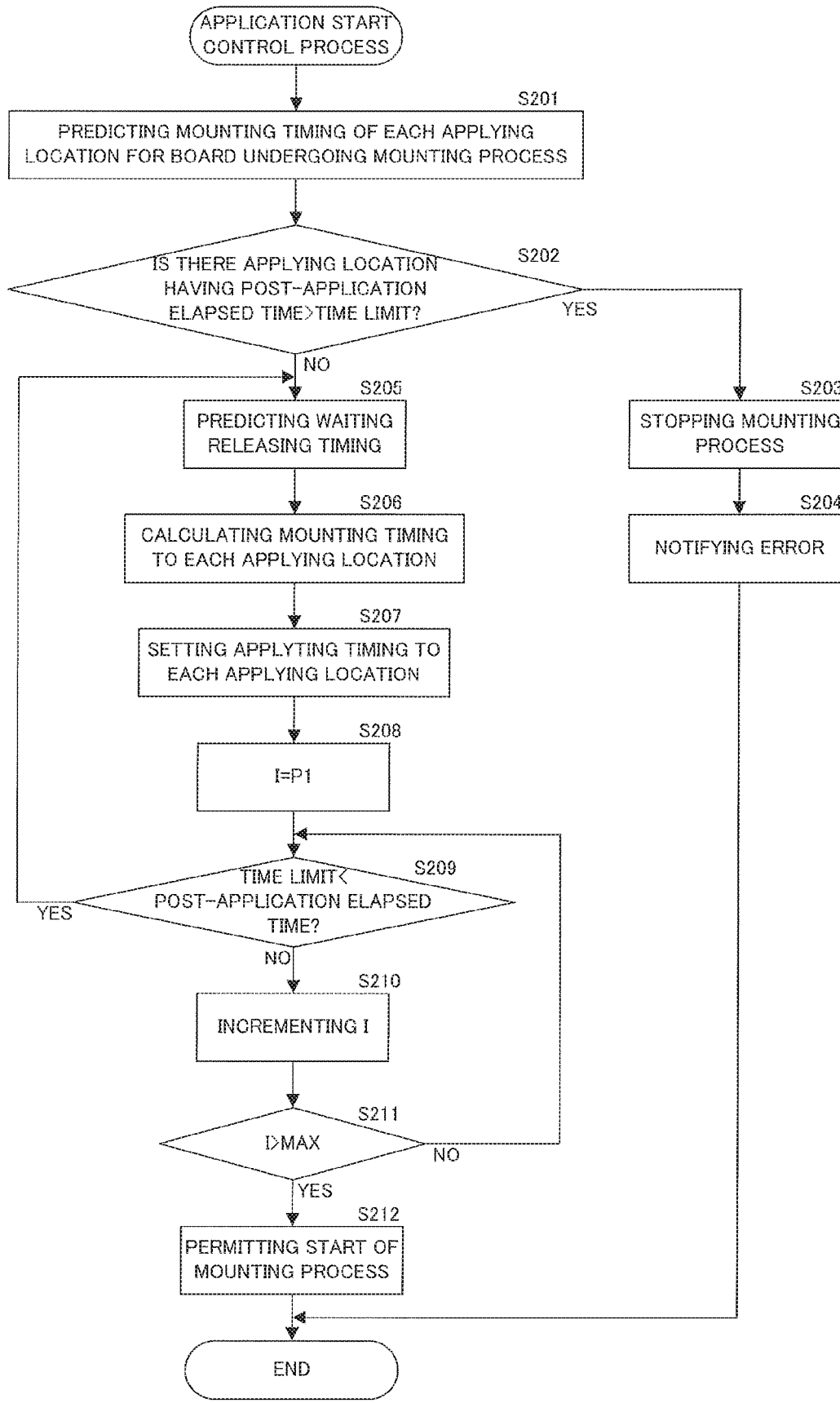
FIG. 10 is a flow chart showing an example of the application start control process.

FIG. 9 is a block diagram showing another example of the electrical configuration provided in the component mounting system of FIG. 1. FIG. 10 is a flow chart showing an example of the application start control process. As shown in FIG. 9, an application start control program 95 is stored in the storage 22 and the controller 21 performs the flow chart of FIG. 10 in accordance with the application start control program 95. This flow chart adjusts the applying timing Td, at which the application material is applied to each applying location P of one board S carried into the dispenser 4, according to the progress of the mounting process on a previous board S already finished with the applying process.

In Step S201, a mounting timing Tm on each applying location P is predicted for the previous board S undergoing the mounting process. Specifically, the controller 21 conducts a simulation on the basis of the progress of the mounting process being performed on the previous board S to obtain the mounting timing Tm at which a component is mounted at the applying location P where no component is mounted yet. In Step S202, it is judged based on the mounting timing Tm predicted in Step S201 whether or not there is any applying location P on the previous board S where the post-application elapsed time Tp exceeds the time limit T1 at the mounting timing Tm. If there is any such applying location P on the previous board S where the post-application elapsed time Tp exceeds the time limit T1 at the mounting timing Tm ("YES" in Step S202), the mounting process on the previous board S is stopped (Step S203) and a message to the effect that an error has occurred is displayed on the display 23 (Step S204). This can urge a maintenance operation to an operator while preventing any further useless mounting of the components by stopping the mounting process on the previous board if there is a large delay in the progress of the mounting process on the previous board S and the components cannot be mounted within the time limit T1 of the adhesive.

On the other hand, if there is no such applying location P on the previous board S in Step S202 (NO), the controller 21 predicts a timing at which one board S can be carried from the buffer conveyors 31 to the component mounter 5A, in other words, a timing at which the one board S is released from waiting at the buffer conveyors 31 (waiting releasing timing Tc) (Step S205) what if the applying process on the one board S is finished in the dispenser 4 and the one board S is carried to the buffer conveyors 31. Specifically, the waiting releasing timing Tc is obtained by the simulation based on the progress of the mounting process being performed on the previous board S. In Step S206, a simulation is conducted under a condition that the one board S is carried into the component mounter 5A at the waiting releasing timing Tc, and the mounting timing Tm at which the component is mounted at each applying location P in the mounting process on the one board S is predicted.

In Step S207, the applying timing Td at which the adhesive is applied to each applying location P of the one board S is predicted when the applying process is started for the one board S in the dispenser 4 after a predetermined margin time (e.g. 1 second) from the present time, and this prediction result is set as the applying timing Td of each applying location P. Then, the parameter I is set at the minimum value, i.e. "P1" (Step S208), and it is judged whether or not an elapsed time (post-application elapsed time Tp) from the applying timing Td predicted for the applying location P1 exceeds the time limit T1 at the mounting timing Tm predicted for the applying location P indicated by the parameter I, i.e. for the applying location P1 (Step S209).

If the post-application elapsed time Tp (=Tm-Td) at the mounting timing Tm is equal to or shorter than the time limit T1 (e.g. 5 minutes) ("NO" in Step S209), the parameter I is incremented in Step S210. If it is judged that the parameter I does not exceed the maximum value, i.e. P19 (NO) in Step S211, a return is made to Step S209. In this way, whether or not an elapsed time from the applying timing Td (post-application elapsed time Tp) exceeds the time limit T1 is predicted in a manner similar to the above for each applying location P indicated by the incremented parameter I.

When steps S209 to S211 are repeated until the parameter I exceeds the maximum value of P19 in Step S211, i.e. when the post-application elapsed time Tp at the mounting timing Tm is judged to be equal to or shorter than the time limit T1 for all the applying locations P1 to P19, the controller 21 permits the dispenser 4 to start the applying process (Step S212). This causes the adhesive to be applied to each applying location P of the one board S at the applying timing set in Step S207.

On the other hand, if there is, out of all the applying locations P1 to P19, any applying location P where the post-application elapsed time Tp at the mounting timing Tm is predicted to exceed the time limit T1 ("YES" in Step S209), the controller 21 returns to Step S205. This causes the applying timing Td to the one board S to be set again (delayed) and judgment in Steps S209 to S211 is made again.

As described above, in the embodiment shown in FIGS. 9 and 10, the controller 21 adjusts the applying timing Td, at which the adhesive is applied, for each applying location P of the one board S according to the progress of the mounting process on the previous board S completed with the application of the adhesive earlier than the one board S. Thus, such as when the progress of the mounting process on the previous board S is later than planned, such an adjustment to delay the applying timing Td, at which the adhesive is applied to each of the applying locations P of the one board S, is possible. As a result, it is possible to mount the components via the adhesive in a satisfactory state by suppressing the post-application elapsed time Tp from the applying timing Td to the mounting timing Tm to be short.

Further, the controller 21 calculates the applying timing Td at which the post-application elapsed time Tp elapsed from the applying timing Td to the mounting timing Tm at which the component is mounted in the mounting process, i.e. a predicted elapsed time is within the time limit T1 for each applying location P of the one board S based on the progress of the mounting process on the previous board S. Then, the dispenser 4 applies the adhesive to each applying location P of the one board S at the calculated mounting timing Td. Thus, it is possible to mount the components via the adhesive in a satisfactory state by suppressing the post-application elapsed time Tp from the applying timing Td to the mounting timing Tm to be short.

Further, the controller 21 predicts the predicted elapsed time based on the progress of the mounting process on the previous board S for each applying location P of the one board S while changing the applying timing Td for each applying location P of the one board S. Then, the adhesive is applied to each applying location P of the one board S at the applying timing Td at which the predicted elapsed time is judged to be within the time limit T for all the applying locations P of the one board S. Thus, it is possible to mount the components via the adhesive in a satisfactory state by suppressing the post-application elapsed time Tp from the applying timing Td to the mounting timing Tm to be short.

Thus, in this embodiment, the component mounting system 1 corresponds to an example of a "component mounting system" of the disclosure, the component mounting unit MU corresponds to an example "component mounting unit" of the disclosure, the component mounter 5 corresponds to an example of a "component mounter" of the disclosure, the controller 21 corresponds to an example of a "controller" of the disclosure, and the board S corresponds to an example of a "board" of the disclosure. Also, the applying location P corresponds to an example of a "target location" of the disclosure, the adhesive corresponds to an example of a "application material" of the disclosure, the post-application elapsed time Tp corresponds to an example of a "post-application elapsed time" of the disclosure, the mounting timing Tm corresponds to an example of a "mounting timing" of the disclosure, the time limit T1 corresponds to an example of a "time limit" of the disclosure, the mounting start control process corresponds to an example of a "determining process" of the disclosure.

In addition, the board conveying unit 3 corresponds to an example of a "board conveying unit" of the disclosure, the X direction corresponds to an example of a "board conveying direction" of the disclosure, the component mounter 5A corresponds to an example of a "most upstream mounter" of the disclosure, the installation location of the buffer conveyor 31 between the dispenser 4 and component mounter 5A corresponds to an example of a "judging location" of the disclosure, and the display 23 corresponds to an example of a "notify unit" of the disclosure. Furthermore, the dispenser 4 corresponds to an example of a "dispenser" of the disclosure, the applying timing Td corresponds to an example of a "applying timing" of the disclosure, the post-application elapsed time Tp which is predicted to be elapsed from the applying timing Td to the mounting timing Tm at which the component is mounted in the mounting process corresponds to an example of a "predicted elapsed time" of the disclosure.

It should be noted that the disclosure is not limited to the above embodiment and various changes can be made on the above embodiment without departing from the gist of the disclosure. For example, the component mounting system 1 of the above embodiment includes the dispenser 4 and applies the adhesive as the "application material" of the disclosure to the applying locations P of the board S. However, the component mounting system 1 may be configured to include a printer as described later instead of the above dispenser 4 and apply solder as the "application material" of the disclosure to the applying locations P of the board S.

FIG. 11 is a plan view schematically showing an example of a printer provided in a component mounting system. This printer 7 applies paste solder to a board S carried to and fixed at a working position by a pair of conveyors 37, 37 constituting a part of a board conveying unit 3. That is, the printer 7 overlaps and holds a mask 71 formed with an opening corresponding to applying locations P on the board S at the working position. Then, by moving a squeegee 72 in contact with the upper surface of the mask 71 in a Y direction, the squeegee 72 slides on the upper surface of the mask 71 and the paste solder on the upper surface of the mask is applied to each applying location P of the board S via the opening of the mask 71. The solder applied by the printer 74 contains moisture and the viscosity of the solder increases due to the evaporation of the moisture in the solder with the elapse of time from the application to the board S.

Also in the component mounting system 1 provided with such a printer 7, applying timings Td may be recorded in an applying process for applying the solder to the board S in a manner similar to the above and the mounting start control process may be performed as in the flow chart of FIG. 7 based on a post-application elapsed time Tp after the application of the solder to each applying location P. In this way, effects similar to those of the embodiment described using FIG. 7 can be exhibited. Further, the applying timing Td of applying the solder to one board S may be adjusted according to a state of progress of a mounting process being performed on the previous board S as in the flow chart of FIG. 10. In this way, effects similar to those of the embodiment described using FIG. 10 can be exhibited.

Further, in the above embodiment, the buffer conveyors 31 between the dispenser 4 and the component mounter 5A are provided with the board recognition unit 6. However, the board recognition unit 6 may be provided in the component mounter 5A. In such a configuration, the controller 21 performs the mounting start control process of FIG. 7 before the component mounter 5 starts the mounting of the components on the board S when the board S carried into the component mounter 5A is detected by the board recognition unit 6.

In addition, in the above embodiment, the component mounting unit MU is constituted by the two component mounters 5. However, the number of the component mounters 5 constituting the component mounting unit MU is not limited to two and may be three or more or one. Note that if the component mounting unit MU is constituted by one component mounter 5, this component mounter 5 and the controller 21 cooperate to function as a "component mounter" of the disclosure. At this time, the functions of the controller 21 may be built in the component mounter 5.

Further, in the above embodiment, an error notification is made using the display 23. However, an error notification may be made using a warning buzzer by sound or a warning light by light.

The invention claimed is:

1. A component mounting system comprising:
  a component mounting unit including a component mounter configured to place components at a plurality of target locations of a board having an application material applied to the target locations and configured to perform a mounting process to place the components at the plurality of target locations of the board in a predetermined mounting sequence by the component mounter;
  a dispenser configured to apply the application material to each of the plurality of target locations of the board; and
  a controller configured to perform a determining process to determine whether to permit the component mounting unit to start the mounting process on the board based on a post-application elapsed time elapsed after the application of the application material to the target locations before the component mounting unit starts the mounting process on the board;
  wherein
  the determining process is a process to predict whether the post-application elapsed time exceeds a time limit at a mounting timing, at which the component is mounted in the mounting process, for each target location, prohibit the start of the mounting process upon determining that there is, out of the plurality of target locations, any target location where the post-application elapsed time exceeds the time limit at the mounting timing, and permit the start of the mounting process upon determining that the plurality of target locations include no target location where the post-application elapsed time exceeds the time limit at the mounting timing;
  the component mounting unit performs the mounting process on the board having the application material applied to each target location by the dispenser; and
  the controller adjusts an applying timing, at which the application material is applied by the dispenser, for each target location of one board according to the progress of the mounting process on a previous board completed with the application of the application material earlier than the one board.

2. The component mounting system according to claim 1, wherein the controller obtains the applying timing, at which a predicted elapsed time elapsed from the applying timing to the mounting timing at which the component is mounted in the mounting process is predicted to be within the time limit for each target location of the one board based on the progress of the mounting process on the previous board, and causes the dispenser to apply the application material to each target location of the one board at the obtained applying timing.

3. The component mounting system according to claim 2, wherein the controller predicts the predicted elapsed time for each target location of the one board based on the progress of the mounting process on the previous board while changing the applying timing for each target location of the one board, and causes the dispenser to apply the application material to each target location of the one board at the applying timing at which the predicted elapsed time is judged to be within the time limit for all the target locations of the one board.

4. A component mounting system comprising:
  a component mounting unit including a component mounter configured to place components at a plurality of target locations of a board having an application material applied to the target locations and configured to perform a mounting process to place the components at the plurality of target locations of the board in a predetermined mounting sequence by the component mounter;

a board conveying unit configured to convey the board in a board conveying direction;

a dispenser configured to apply the application material to each of the plurality of target locations of the board; and a controller configured to perform a determining process to determine whether to permit the component mounting unit to start the mounting process on the board based on a post-application elapsed time elapsed after the application of the application material to the target locations before the component mounting unit starts the mounting process on the board;

wherein the determining process is a process to predict whether the post-application elapsed time exceeds a time limit at a mounting timing, at which the component is mounted in the mounting process, for each target location, prohibit the start of the mounting process upon determining that there is, out of the plurality of target locations, any target location where the post-application elapsed time exceeds the time limit at the mounting timing, and permit the start of the mounting process upon determining that the plurality of target locations include no target location where the post-application elapsed time exceeds the time limit at the mounting timing;

the component mounting unit includes a plurality of the component mounters arranged side by side in the board conveying direction and causes the plurality of component mounters to divide the mounting process, and each component mounter is configured to place the components at the target locations in charge, out of the plurality of target locations of the board carried from an upstream side in the board conveying direction;

the board conveying unit has a judging location provided in a most upstream mounter or upstream in the board conveying direction of the most upstream mounter, the most upstream mounter being located on a most upstream side in the board conveying direction out of the plurality of component mounters;

the controller performs the determining process for the mounting process on the board at the judging location when the board reaches the judging location;

the component mounting unit performs the mounting process on the board having the application material applied to each target location by the dispenser; and the controller adjusts an applying timing, at which the application material is applied by the dispenser, for each target location of one board according to the progress of the mounting process on a previous board completed with the application of the application material earlier than the one board.

5. The component mounting system according to claim 4, wherein the controller obtains the applying timing, at which a predicted elapsed time elapsed from the applying timing to the mounting timing at which the component is mounted in the mounting process is predicted to be within the time limit for each target location of the one board based on the progress of the mounting process on the previous board, and causes the dispenser to apply the application material to each target location of the one board at the obtained applying timing.

6. The component mounting system according to claim 5, wherein the controller predicts the predicted elapsed time for each target location of the one board based on the progress of the mounting process on the previous board while changing the applying timing for each target location of the one board, and causes the dispenser to apply the application material to each target location of the one board at the applying timing at which the predicted elapsed time is judged to be within the time limit for all the target locations of the one board.

7. A component mounting system comprising:

a component mounting unit including a component mounter configured to place components at a plurality of target locations of a board having an application material applied to the target locations and configured to perform a mounting process to place the components at the plurality of target locations of the board in a predetermined mounting sequence by the component mounter;

a notifying unit configured to make a notification to an operator;

a dispenser configured to apply the application material to each of the plurality of target locations of the board; and a controller configured to perform a determining process to determine whether to permit the component mounting unit to start the mounting process on the board based on a post-application elapsed time elapsed after the application of the application material to the target locations before the component mounting unit starts the mounting process on the board;

wherein the determining process is a process to predict whether the post-application elapsed time exceeds a time limit at a mounting timing, at which the component is mounted in the mounting process, for each target location, prohibit the start of the mounting process upon determining that there is, out of the plurality of target locations, any target location where the post-application elapsed time exceeds the time limit at the mounting timing, and permit the start of the mounting process upon determining that the plurality of target locations include no target location where the post-application elapsed time exceeds the time limit at the mounting timing;

the controller controls the notifying unit to notify an error when the prohibition of the start of the mounting process is determined in the determining process;

the component mounting unit performs the mounting process on the board having the application material applied to each target location by the dispenser; and the controller adjusts an applying timing, at which the application material is applied by the dispenser, for each target location of one board according to the progress of the mounting process on a previous board completed with the application of the application material earlier than the one board.

8. The component mounting system according to claim 7, wherein the controller obtains the applying timing, at which a predicted elapsed time elapsed from the applying timing to the mounting timing at which the component is mounted in the mounting process is predicted to be within the time limit for each target location of the one board based on the progress of the mounting process on the previous board, and causes the dispenser to apply the application material to each target location of the one board at the obtained applying timing.

9. The component mounting system according to claim 8, wherein the controller predicts the predicted elapsed time for each target location of the one board based on the progress of the mounting process on the previous board while changing the applying timing for each target location of the one board, and causes the dispenser to apply the application material to each target location of the one board at the applying timing at which the predicted elapsed time is judged to be within the time limit for all the target locations of the one board.

10. A component mounting system comprising:
- a component mounting unit including a component mounter configured to place components at a plurality of target locations of a board having an application material applied to the target locations and configured to perform a mounting process to place the components at the plurality of target locations of the board in a predetermined mounting sequence by the component mounter;
- a board conveying unit configured to convey the board in a board conveying direction;
- a notifying unit configured to make a notification to an operator;
- a dispenser configured to apply the application material to each of the plurality of target locations of the board; and
- a controller configured to perform a determining process to determine whether to permit the component mounting unit to start the mounting process on the board based on a post-application elapsed time elapsed after the application of the application material to the target locations before the component mounting unit starts the mounting process on the board;

wherein the determining process is a process to predict whether the post-application elapsed time exceeds a time limit at a mounting timing, at which the component is mounted in the mounting process, for each target location, prohibit the start of the mounting process upon determining that there is, out of the plurality of target locations, any target location where the post-application elapsed time exceeds the time limit at the mounting timing, and permit the start of the mounting process upon determining that the plurality of target locations include no target location where the post-application elapsed time exceeds the time limit at the mounting timing;

the component mounting unit includes a plurality of the component mounters arranged side by side in the board conveying direction and causes the plurality of component mounters to divide the mounting process, and each component mounter is configured to place the components at the target locations in charge, out of the plurality of target locations of the board carried from an upstream side in the board conveying direction;

the board conveying unit has a judging location provided in a most upstream mounter or upstream in the board conveying direction of the most upstream mounter, the most upstream mounter being located on a most upstream side in the board conveying direction out of the plurality of component mounters;

the controller performs the determining process for the mounting process on the board at the judging location when the board reaches the judging location;

the controller controls the notifying unit to notify an error when the prohibition of the start of the mounting process is determined in the determining process;

the component mounting unit performs the mounting process on the board having the application material applied to each target location by the dispenser; and the controller adjusts an applying timing, at which the application material is applied by the dispenser, for each target location of one board according to the progress of the mounting process on a previous board completed with the application of the application material earlier than the one board.

11. The component mounting system according to claim 10, wherein the controller obtains the applying timing, at which a predicted elapsed time elapsed from the applying timing to the mounting timing at which the component is mounted in the mounting process is predicted to be within the time limit for each target location of the one board based on the progress of the mounting process on the previous board, and causes the dispenser to apply the application material to each target location of the one board at the obtained applying timing.

12. The component mounting system according to claim 11, wherein the controller predicts the predicted elapsed time for each target location of the one board based on the progress of the mounting process on the previous board while changing the applying timing for each target location of the one board, and causes the dispenser to apply the application material to each target location of the one board at the applying timing at which the predicted elapsed time is judged to be within the time limit for all the target locations of the one board.

* * * * *